US011603602B2

(12) United States Patent
Nian et al.

(10) Patent No.: US 11,603,602 B2
(45) Date of Patent: *Mar. 14, 2023

(54) METHOD FOR CONTROLLING ELECTROCHEMICAL DEPOSITION TO AVOID DEFECTS IN INTERCONNECT STRUCTURES

(71) Applicant: Taiwan Semiconductor Manufacturing Co., Ltd., Hsinchu (TW)

(72) Inventors: Jun-Nan Nian, Hsinchu (TW); Shiu-Ko Jangjian, Hsinchu (TW); Yu-Ren Peng, Hsinchu (TW); Yao-Hsiang Liang, Hsinchu (TW); Ting-Chun Wang, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/238,080

(22) Filed: Apr. 22, 2021

(65) Prior Publication Data
US 2021/0238765 A1 Aug. 5, 2021

Related U.S. Application Data

(62) Division of application No. 16/698,528, filed on Nov. 27, 2019, now Pat. No. 11,015,260.
(Continued)

(51) Int. Cl.
*C25D 7/12* (2006.01)
*C25D 21/12* (2006.01)
(Continued)

(52) U.S. Cl.
CPC .............. *C25D 7/123* (2013.01); *C25D 3/38* (2013.01); *C25D 17/00* (2013.01); *C25D 17/001* (2013.01);
(Continued)

(58) Field of Classification Search
CPC .......... C25D 7/12–123; H01L 21/2885; H01L 21/76873
See application file for complete search history.

(56) References Cited

U.S. PATENT DOCUMENTS 6,511,588 B1   1/2003  Kobayashi et al.
2004/0115932 A1* 6/2004 Cheng .................. C25D 5/02
                                               205/97
(Continued)

FOREIGN PATENT DOCUMENTS

JP    2001-89896 A    4/2001
JP    2004-263218 A   9/2004
(Continued)

OTHER PUBLICATIONS

Lou et al., Electroplating, Encyclopedia of Chem. Proc. (Year: 2006).*

Primary Examiner — Ho-Sung Chung
(74) Attorney, Agent, or Firm — Seed IP Law Group LLP

(57) ABSTRACT

A method for performing an electrochemical plating (ECP) process includes contacting a surface of a substrate with a plating solution comprising ions of a metal to be deposited, electroplating the metal on the surface of the substrate, in situ monitoring a plating current flowing through the plating solution between an anode and the substrate immersed in the plating solution as the ECP process continues, and adjusting a composition of the plating solution in response to the plating current being below a critical plating current such that voids formed in a subset of conductive lines having a highest line-end density among a plurality of conductive (Continued)

lines for a metallization layer over the substrate are prevented.

20 Claims, 10 Drawing Sheets

Related U.S. Application Data

(60) Provisional application No. 62/774,100, filed on Nov. 30, 2018.

(51) Int. Cl.
    *C25D 3/38*     (2006.01)
    *H01L 21/768*     (2006.01)
    *C25D 17/00*     (2006.01)

(52) U.S. Cl.
    CPC .......... *C25D 17/005* (2013.01); *C25D 21/12* (2013.01); *H01L 21/76873* (2013.01); *H01L 21/76877* (2013.01)

(56) References Cited

U.S. PATENT DOCUMENTS

| | | | | |
|---|---|---|---|---|
| 2005/0274621 A1* | 12/2005 | Sun | ............... | H01L 21/76861 |
| | | | | 205/291 |
| 2007/0190341 A1* | 8/2007 | Furuya | ............... | C25D 7/123 |
| | | | | 428/446 |
| 2012/0138471 A1* | 6/2012 | Mayer | ............... | C25D 3/60 |
| | | | | 204/275.1 |
| 2015/0284871 A1* | 10/2015 | Kondo | ............... | C25D 17/001 |
| | | | | 205/84 |
| 2016/0372421 A1* | 12/2016 | Nian | ............... | C25D 3/38 |

FOREIGN PATENT DOCUMENTS

| | | |
|---|---|---|
| JP | 2016-74975 A | 5/2016 |
| KR | 10-2004-0097337 A | 11/2004 |
| KR | 10-2012-0070520 A | 6/2012 |
| KR | 10-2015-0086184 A | 7/2015 |
| KR | 10-2016-0122076 A | 10/2016 |
| TW | 200704830 A | 2/2007 |
| TW | 200732518 A | 9/2007 |
| TW | 201702436 A | 1/2017 |

\* cited by examiner

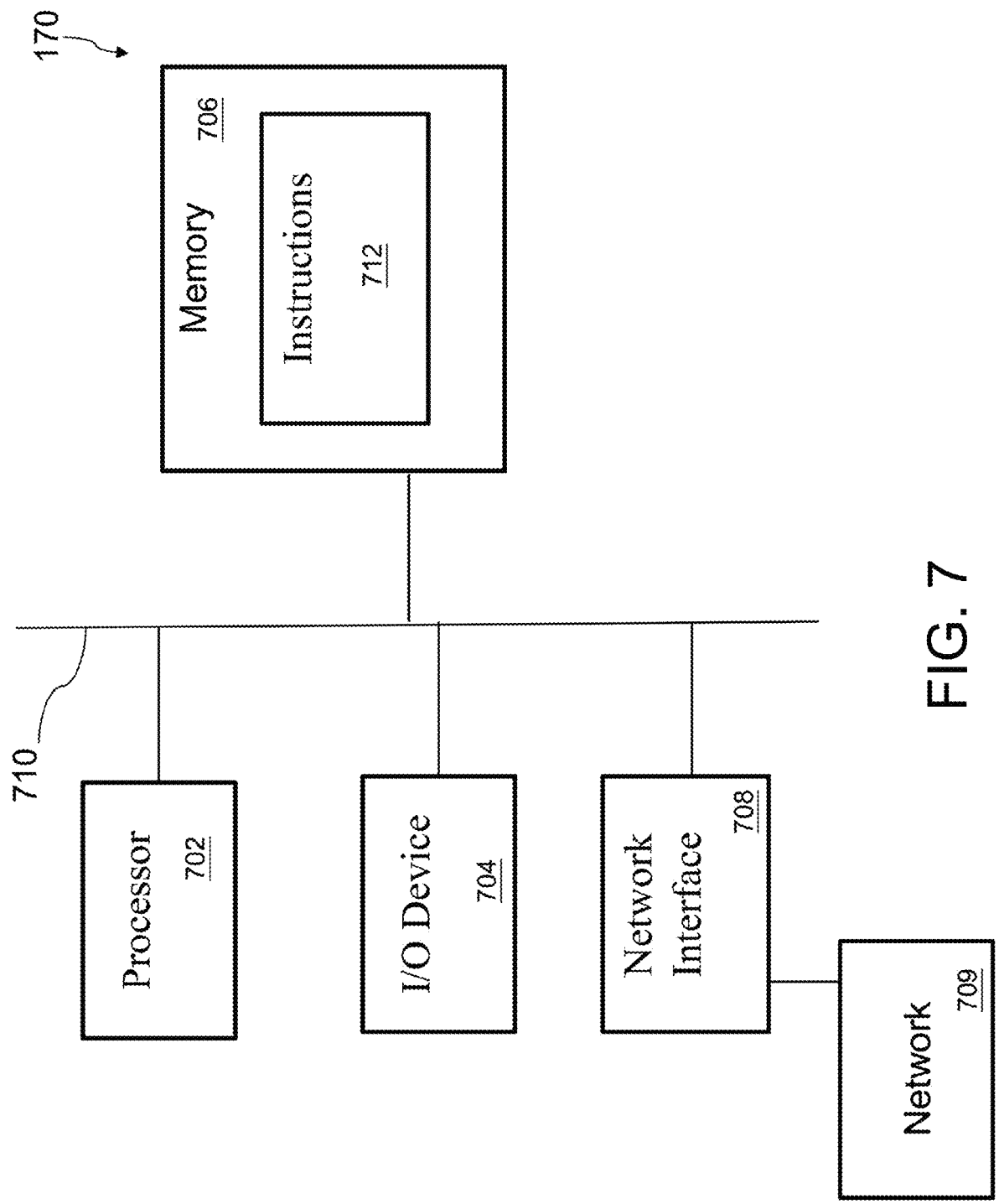

METHOD FOR CONTROLLING ELECTROCHEMICAL DEPOSITION TO AVOID DEFECTS IN INTERCONNECT STRUCTURES

BACKGROUND

Integrated circuits include numerous devices such as transistors, capacitors, resistors, and diodes. These devices, which are initially isolated from one another, are interconnected together through wiring to form functional circuits. Such wiring is done through multiple metallization layers including metal lines, providing lateral electrical connection, and a plurality of vias, providing vertical electrical connection between two neighboring stacked metallization layers. The metal lines and vias are commonly referred to as interconnect structures. Interconnect structures are increasingly determining the limits of performance and the density of advanced integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a diagram of a control system for controlling operation of an ECP system, in accordance with some embodiments.

DETAILED DESCRIPTION

Figure 1:
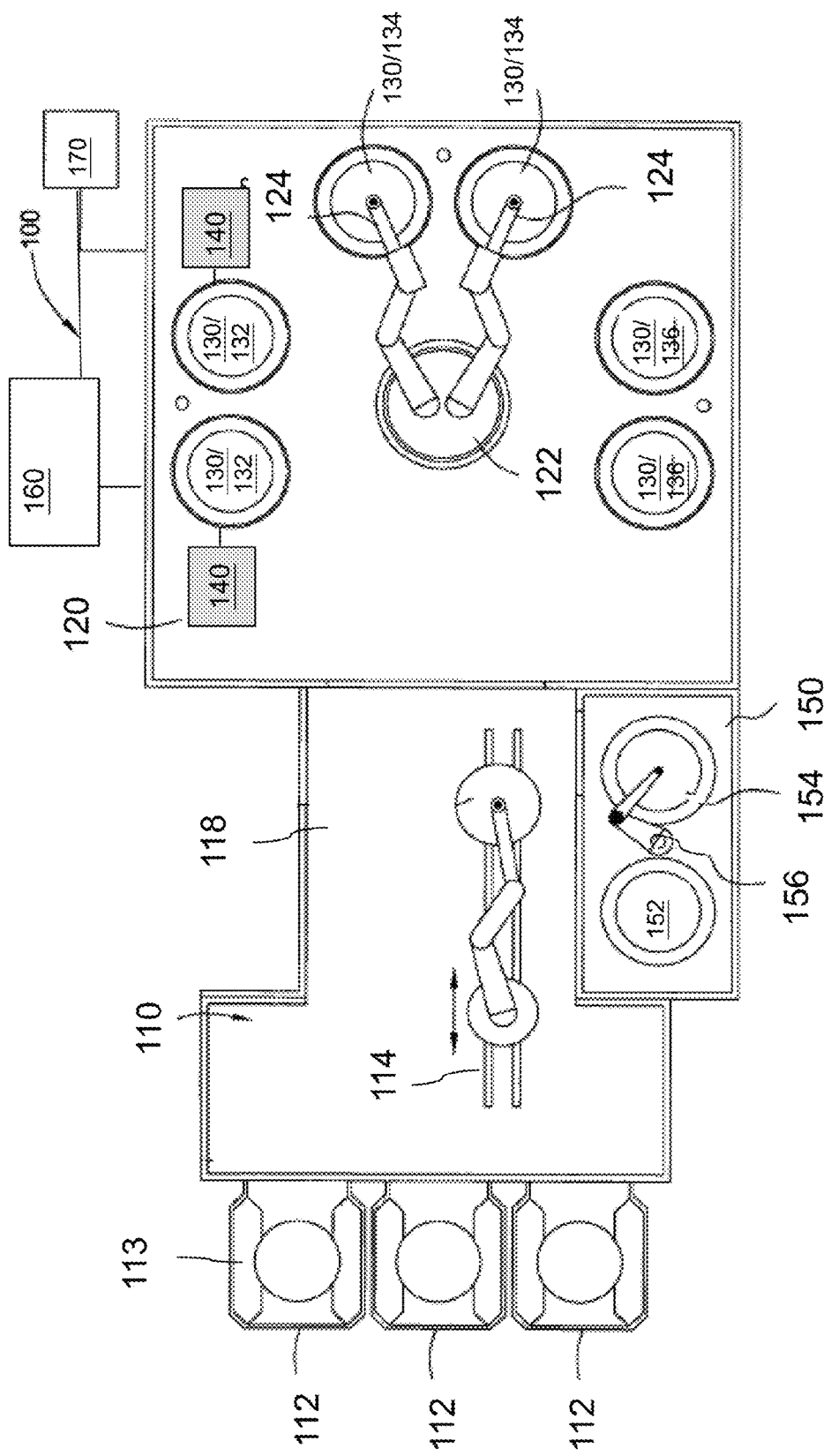
FIG. 1 is a plan view of an electrochemical plating (ECP) system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Copper and copper alloys have been widely used for filling sub-micro, high aspect ratio features on semiconductor substrates. Copper and copper alloys have lower resistivity and higher electromigration resistance compared to the other metals such as, for example, aluminum. These characteristics are critical for achieving higher current densities and increased device speed. In manufacturing interconnect structures including copper, damascene technique (i.e., single damascene or dual damascene) is performed, in which a dielectric layer is first deposited over a semiconductor substrate. The dielectric layer is then patterned to form contact openings such as trenches and/or vias therein. Next, a barrier layer is laid over the dielectric layer to prevent diffusion of the subsequently applied copper into the dielectric layer, followed by physical or chemical vapor deposition of a seed layer to provide electrical conductivity for a sequential plating process. The contact openings are subsequently filled with copper or copper alloys, which are then planarized using, for example, a chemical mechanical polishing (CMP) process.

Deposition of copper in a damascene process is accomplished by an electrochemical plating (ECP) process. During electrochemical plating, the semiconductor substrate is electrically biased to serve as a cathode. The semiconductor substrate with the patterned dielectric layer is immersed into a plating solution containing copper ions. The copper ions are reduced at the surface of the seed layer to form electrodeposited copper. The ECP process continues until the contact openings are filled with copper.

In addition to inorganic constituents in the form of copper salts, the plating solution contains organic additives such as suppressor, accelerator, and leveler for achieving desired deposition properties. One of the key functions of the organic additives is to ensure the ECP process fills the contact openings, in a direction from bottom to top, to avoid formation of pin holes or voids that degrade device performance and reliability. When used in appropriate concentrations, these organic additives enable void-free metal filling through accelerating copper deposition at the bottoms of the contact openings and suppressing copper deposition on the upper corners of the contact openings.

Circuit components are not uniformly distributed on a semiconductor substrate, and the densities of metal lines in a metallization layer across the semiconductor substrate are thus different. For example, in one chip region which has a relatively high device density, dense metal lines are present due to a higher device density requiring a larger number of electrical connections, while in another chip region with a relatively low device density, the density of the metal lines is also low because a lower device density requires a smaller number of electrical connections. Metal lines in a higher density region possess a higher line-end density, while metal lines in a lower density region possess a lower line-end density.

Line-end densities influence gap filling behavior of metal during the ECP process. During plating, the local current density in a lower line-end density region is higher than the local current density in a higher line-end density region since the overall plating current to the semiconductor substrate is fixed. The relative low current density in the higher line-end density region leads to a relative slow bottom-up growth rate. As a metal such as copper is deposited, copper tends to be built up more easily at the entrance of the contact openings in the higher line-end density region if the bottom-up growth rate is not fast enough. The "build-up" or "overhang" blocks the path for the copper deposition and often results in voids formation in the contact openings in the higher line-end density region. Voids often cause the failure of metal lines, and reduce the reliability of the integrated circuits.

Good (i.e., void-free) metal filling has been observed when atomic ratio of carbon and copper in the electroplated copper is greater than 1%. However, a consequence of the ECP operation is the degradation of the organic additives over time. As organic additives degrade, especially when the suppressor which is employed to suppress the plating rate at the corners of the contact openings degrades, the plating current reduces and the copper plating rate at the corners of the contact opening increases. Once a certain amount of organic additives degrades causing atomic ratio of carbon and copper in the electroplated copper is less than 1%, i.e., the plating current is reduced to a certain value, the overhang starts to occur in a region where the contact openings have the highest line-end density. However, in some approaches, the overhang of the electroplated copper at the entrance of the contact openings is not able to be caught in real time. The voids in the electroplated copper can only be found after a batch of semiconductor wafers have been processed using the ECP process. The production yield is hence adversely affected.

In some embodiments, an electrochemical plating (ECP) system that is capable of preventing overhang formation for a given metallization layer during electrochemical deposition of metal in the contact openings is provided. The ECP system is configured to allow in situ monitoring the plating current as the electrochemical deposition progresses. The value of the plating current is compared with a critical plating current value below which voids start to occur in metal lines having the highest line-end density for a specific metallization layer. Once the plating current is observed to be below the critical plating current value, the ECP system adjusts the amount of the organic additives in the plating solution to increase the plating current until the plating current is above the critical plating current. As a result, void-free electroplated metal lines with different line-end densities are obtained across the substrate. The ECP system of the present disclosure in various embodiments thus helps to prevent formation of voids in interconnect structures and to improve reliability of integrated circuits.

FIG. 1 is a top plan view of an ECP system 100, in accordance with some embodiments.

Referring to FIG. 1, the ECP system 100 includes a factory interface 110, a processing mainframe 120, an anneal chamber 150, a plating solution supply system 160 and a control system 170. The processing mainframe 120 and the anneal chamber 150 are in communication with the factory interface 110.

The factory interface 110 includes a plurality of substrate loading stations 112 configured to interface with and retain substrate-containing cassettes 113. A factory interface robot 114 is positioned in the factory interface 110 and is configured to access and transfer a substrate into and out of cassettes 113 on the substrate loading stations 112. The factory interface robot 114 also extends into a link tunnel 118 that connects the factory interface 110 to the processing mainframe 120. The position of the factory interface robot 114 allows the robot to access to the substrate loading stations 112 to retrieve a substrate from one of the cassettes 113 on the substrate loading stations 112 and then deliver the substrate to the processing mainframe 120. Additionally, the factory interface robot 114 is operable to transfer a substrate into or out of the anneal chamber 150. Furthermore, after an ECP processing sequence is completed, the factory interface robot 114 is operated to return the substrate to one of the cassettes 113 positioned on the substrate loading stations 112 for removal from the ECP system 100.

The processing mainframe 120 includes a mainframe robot 122 and a plurality of processing cells 130 positioned on the processing mainframe 120. The mainframe robot 122 includes one or more robot blades 124 configured to support and transfer the substrates. Additionally, the mainframe robot 122 and robot blades 124 are configured to independently extend, rotate, pivot, and vertically move so that the mainframe robot 122 is capable of simultaneously inserting and removing substrates to/from the plurality of processing cells 130. In some embodiments, the mainframe robot 122 is a flipper robot that facilitates transfer of a substrate from a face-up position on the robot blade 124 of the mainframe robot 122 to a face down position for a processing cell 130 that requires face-down processing of substrate.

The processing cells 130 are configured to be utilized in an ECP process, for example, as ECP cells, rinsing cells, substrate bevel clean cells, spin rinse dry cells, substrate surface cleaning cells, and other cells that are used in conjunction with a plating platform. In some embodiments, the processing cells 130 include one or more ECP cells 132, one or more spin rinse dry (SRD) cells 134, and one or more substrate bevel cleaning cells 136. Although in the illustrated embodiment of FIG. 1, two processing cells 130 are configured as ECP cells 132, it will be understood that the number of ECP cells 132 is not so limited, and any number of ECP cells 132 are contemplated. The ECP cells 132 are further described below with respect to FIG. 2.

Each of the ECP cells 132 is coupled to a monitoring device 140. Each monitoring device 140 is adapted to in situ measure the plating current flowing through a plating solution between electrodes (e.g., between anode 201 and substrate 202 in FIG. 2) in a corresponding ECP cell 132 as the ECP process continues. The in situ measured plating current is compared with a critical plating current and once the value of the measured plating current is less than the critical plating current value, the concentration of the organic additives in the plating solution (e.g., plating solution 230 in FIG. 2) is adjusted to increase the plating current, thereby reducing the metal deposition rate at the entrance of the contact openings and increasing the metal deposition rate within the contact openings. The monitoring device 140 thus helps to obtain void-free electroplated metal for metal lines with different line-end densities for a given metallization layer across the substrate. The monitoring devices 140 are further described below with respect to FIG. 2.

The anneal chamber 150 is adapted to anneal the electroplated metal film after the ECP process. The annealing helps to increase the grain size, evolve impurities, and reduce the resistance of resulting metal lines. The annealing also help to stabilize the microstructure to ensure that the subsequently performed CMP removal rate is reproducible. In some embodiments, the anneal chamber 150 is a two-position annealing chamber including a cooling plate 152 and a heating plate 154 positioned adjacent to the cooling plate 152. A substrate transfer robot 156 is positioned between the cooling plate 152 and the heating plate 154. The substrate transfer robot 156 is configured to move a substrate between the cooling plate 152 and the heating plate 154.

The plating solution supply system 160 is individually connected to the ECP cells 132 and is configured to supply and circulate the plating solution through the ECP cells 132 during the ECP process. Additionally, the SRD cells 134 and substrate bevel cleaning cells 136 are also in communication with a fluid delivery system (not shown) configured to supply the necessary cleaning fluids to the respective cells 134 and 136 during the ECP process. In some embodiments, the fluid delivery system can also be used to supply the plating solution to ECP cells 132.

Components in the ECP system 100 are in communication with a control system 170. The control system 170 is configured to receive from both a user and/or various monitoring devices in the ECP system 100 and to control operation of the ECP system 100 in accordance with the inputs and/or a predetermined processing recipe.

Figure 2:
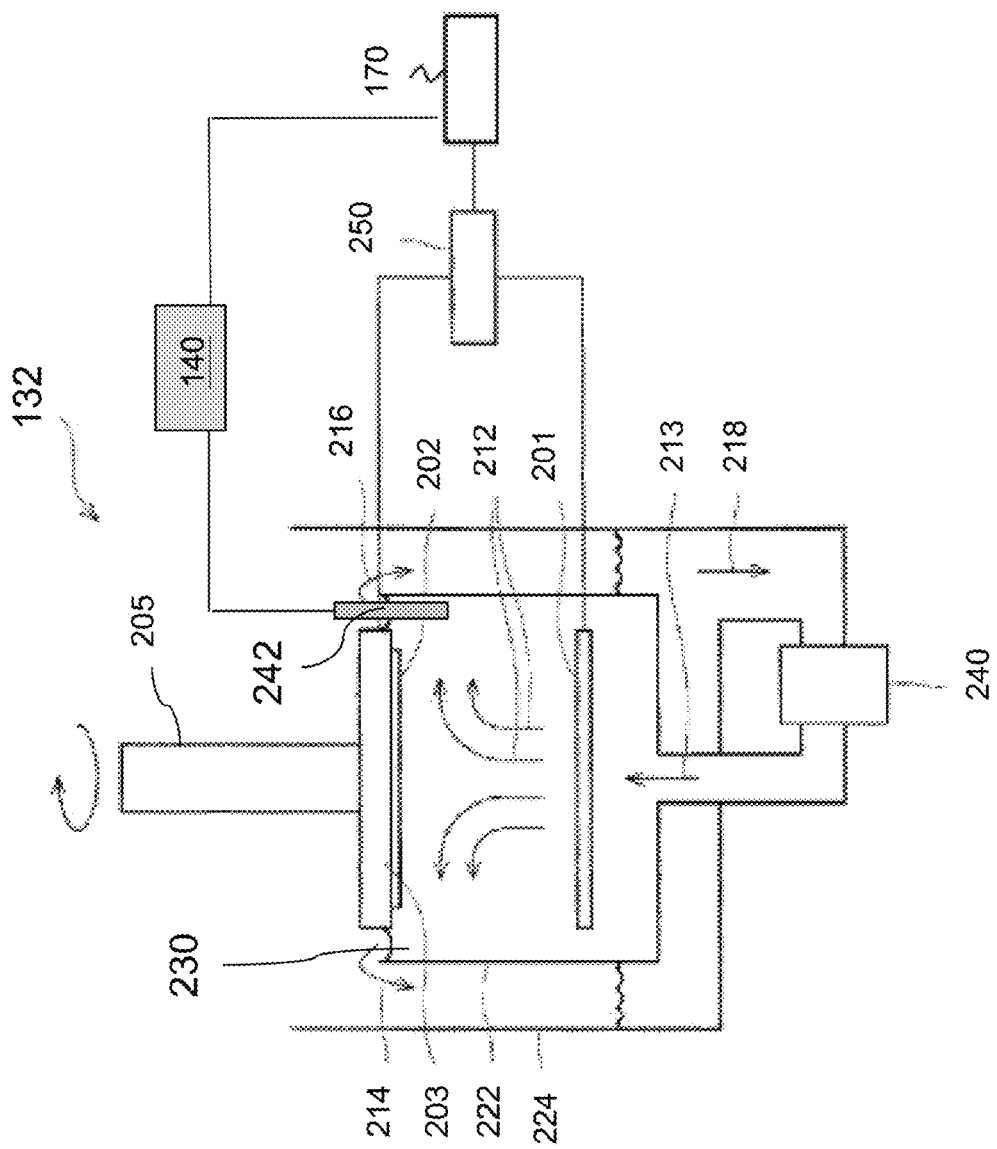
FIG. 2 is a schematic view of an ECP cell and a monitoring device in the ECP system, in accordance with some embodiments.

FIG. 2 is a schematic diagram of an ECP cell 132 and a monitoring device 140 in an ECP system, e.g., ECP system 100, in accordance with some embodiments.

Referring to FIG. 2, the ECP cell 132 includes an anode 201, a substrate holder 203 mounted on a rotatable spindle 205, a power supply 250 coupled to the anode 201 and the substrate holder 203, and a plating bath 222. The power supply 250 is coupled to the control system 170. The plating bath 222 contains a plating solution 230, and the anode 201 is disposed within the plating solution 230. In some embodiments, the anode 201 includes a source of a metal (e.g., copper) that is to be plated onto the substrate 202.

During an electrochemical plating cycle, a substrate 202 is mounted in the substrate holder 203, which is then placed in the plating bath 222. As indicated by arrows 212 and 213, the plating solution 230 is continually applied to the plating bath 222 by a pump 240. Generally, the plating solution 230 flows upwards to the center of the substrate 202 and then flows radially outward and across the substrate 202. The plating solution 230 then flows from the plating bath 222 to an overflow reservoir 224 as indicated by arrows 214 and 216. The plating solution 230 is then be filtered (not shown) and returned to the pump 240 as indicated by arrow 218, completing recirculation. The power supply 250, such as a DC power supply, has a negative output lead electrically connected to the substrate 202 via the substrate holder 203. The positive output lead of power supply 250 is electrically connected to the anode 201 located in plating bath 222. During the ECP process, the power supply 250 biases the substrate 202 to provide a negative potential relative to the anode 201 generating electrical current from the anode 201 to the substrate 202. Electrical current flows in the same direction as the net positive ion flux and opposite to the net electron flux. This causes an electrochemical reaction (e.g., $Cu^{2+}+2e=Cu$) on the substrate 202 which results in deposition of metal (e.g., copper) thereon. The ion concentration of the plating solution 230 is replenished during the plating cycle, e.g., by dissolution of the anode 201 (e.g., $Cu=Cu^{2+}+2e$).

The plating solution 230 includes a metal salt containing ions of the metal to be electroplated on the substrate 202. In instances where the metal that is to be electroplated onto the substrate 202 is copper, the anode 201 is made of copper, and the plating solution 230 includes a mixture of copper salt, acid, water and various organic and inorganic additives that improve the properties of the deposited copper. Examples of copper salts in the plating solution 230 include, but are not limited to, copper sulfate, copper cyanide, copper sulfamate, copper chloride, copper fluoride, copper nitrate, copper oxide, copper fluoroborate, copper trifluoroacetate, copper pyrophosphate, and copper methane sulfonate, and hydrates of any of the foregoing compounds. The concentration of the copper salt used in the plating solution 230 varies depending on the particular copper salt used. Examples of acids used in the electroplating solution include, but are not limited to, sulfuric acid, methane sulfonic acid, fluoroboric acid, hydrochloric acid, hydroiodic acid, nitric acid, and phosphoric acid. The concentration of the acid used in the plating solution 230 varies depending on the particular acid used.

The plating solution 230 further comprises organic additives that improve electroplating characteristics of the metal. The organic additives help to eliminate void formation by suppressing the electrodeposition rate at protruding areas in the surface of the substrate 202 and/or by accelerating the electrodeposition rate in recessed areas in the surface of the substrate 202. Organic additives employed in a copper plating solution include suppressors, accelerators, and levelers. Suppressors are macromolecule deposition inhibitors that tend to adsorb over the surface of the substrate 202 and reduce local deposition rates, increasing the deposition uniformity. Examples of suppressors include, but are not limited to, polyethers, such a polyethylene glycol, and other polymers such as polypropylene oxide. Accelerators are organic molecules that tend to counter the suppressive effect of the suppressors and provide accelerated deposition within substrate recesses. Examples of accelerators include, but are not limited to, organic sulfide compounds, such as bis (sodium sulfopropyl)-disulfide, 3-mercapto-1-propane sulfonic acid sodium salt, N-dimethyl-dithiocarbamyl propylsulfonic acid sodium salt, and 3-S-isothiuronium propyl sulfonate. Levelers usually have ingredients with nitrogen functional group and in some instances are added to the plating solution 230 at a relatively low concentration. The leveling involves the diffusion or migration of strongly current suppressing species to corners or edges of contact openings which otherwise plate more rapidly than desired due to electric field and solution mass transfer effects. Examples of the levelers include, but are not limited to, polyether surfactants, polyethylene glycol surfactants, polyacrylic acids, polyamines, polyacrylamides, phenazine azo-dyes, alkoxylated amine surfactants, and polymer pyridine derivatives.

However, during the ECP process, these organic additives react with the anode. The reaction causes the organic additives to decompose, which renders the organic additive ineffective. As such, the concentration of the organic additives in the plating solution is reduced as a result of consumption in the plating process. The plating current flowing between the anode 201 and the substrate 202 is gradually reduced over time. Once the plating current is reduced to a value that is below a critical plating current value, overhang and the resulting voids start to generate in the electroplated copper in contact openings having the highest line-end density due to the increase of the copper plating rate at the corners of the contact openings. To help to form void-free electroplated metal fill across the substrate 202, the plating current flowing through the substrate 202 is in situ measured using the monitoring device 140 as the ECP process continues to determine when overhang starts to occur at the corners of the contact openings having the highest line-end density, and to adjust the amount of organic additives in the plating solution, before voids are formed. For example, in some embodiments, the amount of organic additives is adjusted to ensure atomic ratio of carbon and copper in the electroplated copper is greater than 1%.

The monitoring device 140 is disposed outside the ECP cell 132. In some embodiments, the monitoring device 140 is a current meter. The monitoring device 140 includes a probe 242 adapted to be partially immersed in the plating solution 230. The probe 242 is in contact with the plating solution 230 to in situ measure the current flowing through the plating solution between the anode 201 and the substrate. In some embodiments, the probe 242 is made of a metal to be electroplated on the substrate 202 or a metal to be electroplated over a noble metal. Examples of the noble metals include, but are not limited to, platinum, gold, palladium, iridium, and ruthenium. In instances where the metal that is to be electroplated onto the substrate 202 is copper, the probe 242 is wires made of copper or copper plated noble metal. It should be noted that although FIG. 2 illustrates the probe 242 is placed in the plating bath 222, the probe 242 being placed in the overflow reservoir 224 is also contemplated.

The ECP cell 132 and the monitoring device 140 are in communication with the control system 170. The control system 170 is configured to output control signals to the power supply 250 or other controllable components in the ECP cell 132 to adjust the localized intensity of the electric field, thus, performing a control over the plating processes. The control system 170 is also configured to receive information from the monitoring device 140. In some embodiments, the control system 170 receives information related to the plating current from the monitoring device 140. Based on the plating current received from the monitoring device 140, the control system 170 is configured to compare the in-situ measured plating current with a critical plating current below which voids are formed in electroplated metal lines having the highest line-end density for a given metallization layer. In some embodiments, the control system 170 is configured to adjust the composition of the plating solution 230, i.e., the concentration of organic additives such as suppressors, accelerators, and levelers in the plating solution 230 once the value of the plating current is decreased to a value that is below the critical plating current value.

Figure 3:
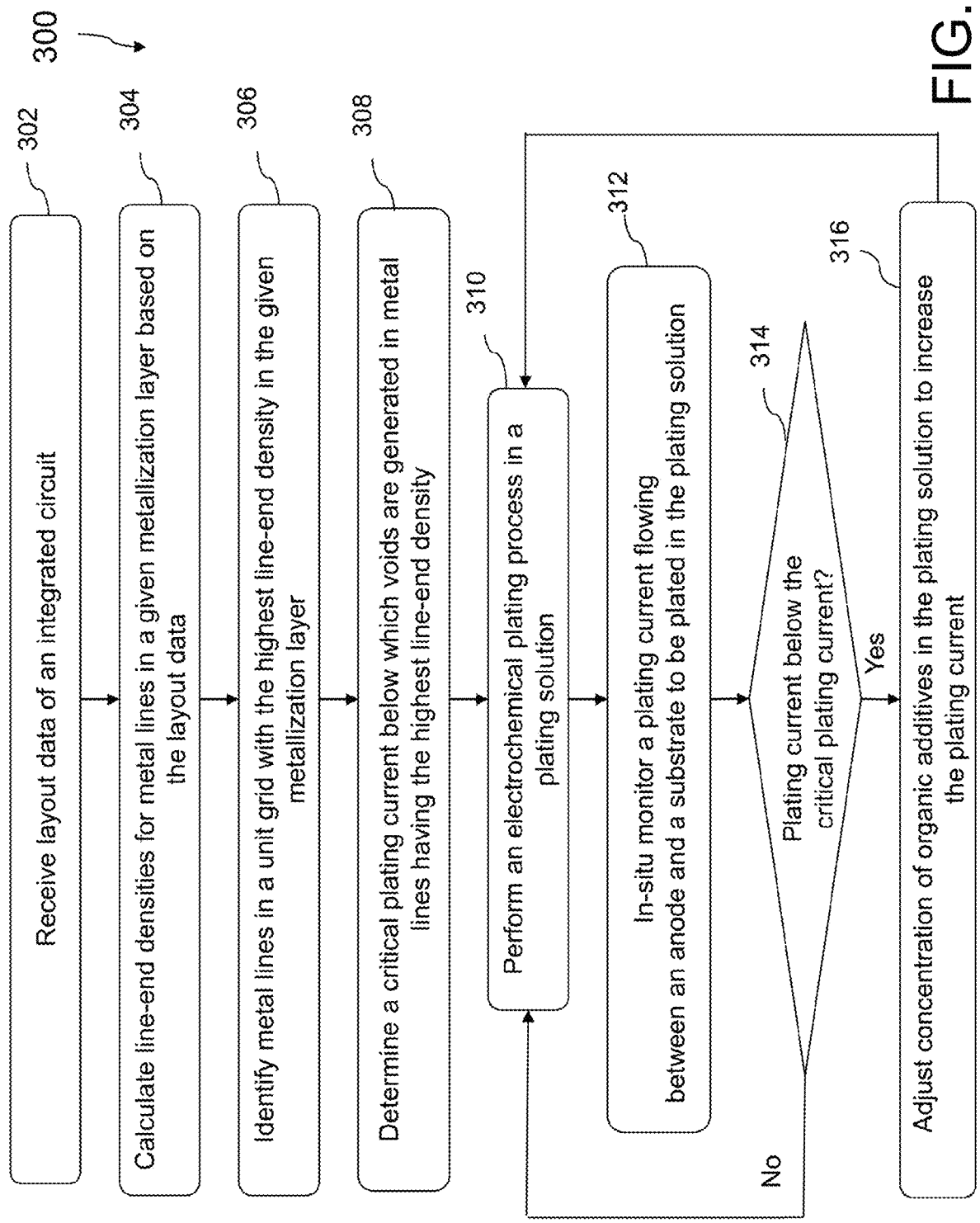
FIG. 3 is a flowchart of a method of using an ECP system, in accordance with some embodiments.

FIG. 3 is a flowchart of a method 300 of using the ECP system 100, in accordance with some embodiments. In some embodiments, additional operations are performed before, during, and/or after the method 300, or some of the operations described are replaced and/or eliminated. One of ordinary skill in the art would understand that although some embodiments are discussed with operations performed in a particular order, these operations may be performed in another logical order.

Referring to FIG. 3, the method 300 includes operation 302, in which a layout data of an integrated circuit is received. The layout data, for a non-limiting example, is provided in GDSII format, although other formats of graphical design data for integrated circuits could be used. The layout data includes layout data for metallization layers in the integrated circuit.

In operation 304 of the method 300 (FIG. 3), based on the layout data, line-end densities of metal lines in a given metallization layer are calculated. For example, if the metallization layer to be evaluated is the first metallization layer that is closest to a substrate, then the layout data corresponding to the metal lines for the first metallization layer are extracted. To calculate the line-end densities, the entire substrate area is divided into a plurality of unit grids and line-end densities for metal lines in each unit grid for the given metallization layer are calculated. For each unit grid over the substrate, the line-end density (LeD) is calculated as the ratio between the surface area of the metal lines and the area of the unit grid.

In operation 306 of the method 300 (FIG. 3), the metal lines in a unit grid having the highest line-end density for the given metallization layer is identified.

In operation 308 of the method 300 (FIG. 3), a critical plating current value in the ECP process, below which void are formed in metal lines that have the highest line-end density for a given metallization layer, is determined. In some embodiments, the critical plating current that corresponds to a line-end density is determined using a linear model (FIG. 4) empirically obtained. In determining the critical plating currents corresponding to different line-end densities, several contact openings with known line-end density values are selected. For each of the selected line-end densities, different currents are applied to cause the deposition of metal in the contact openings. After deposition, the resulting metal lines are inspected by a wafer inspection system to detect defects such as voids in the metal lines. In some embodiments, the metal lines are imaged using scanning electron microscope (SEM), transmission electron microscopy (TEM), or electron backscatter diffraction to detect voids therein. For a given line-end density, a plating current below which the voids start to occur is set as the critical plating for the given line-end density. The correlation between the critical plating currents and line-end densities is thus established.

Figure 4:
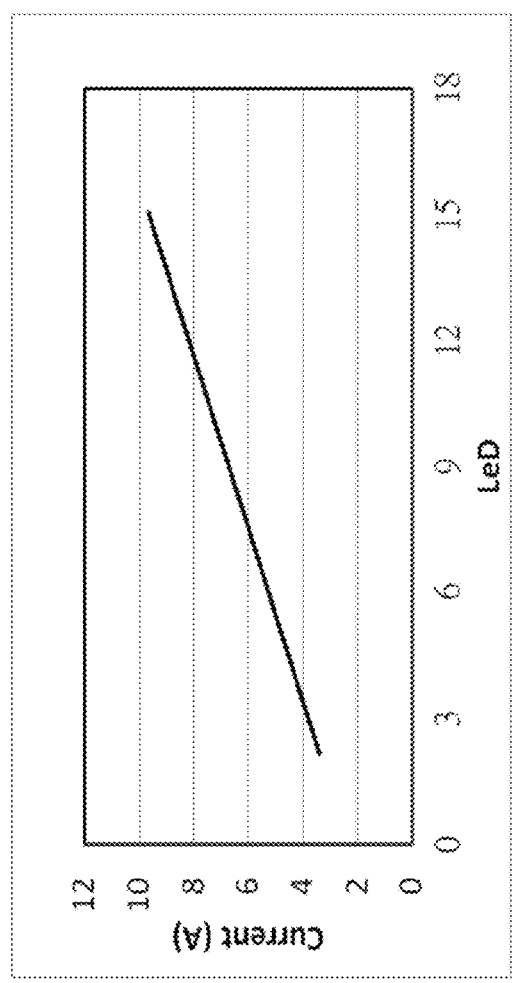
FIG. 4 is a plot illustrating the relationship between critical plating current and line-end density.

FIG. 4 is a plot illustrating the relationship between critical plating current (A) in an ECP cell (e.g., ECP cell 132, FIG. 2) and line-end density (LeD) for a given metallization layer on a wafer, in accordance with some embodiments of the present disclosure. As shown in FIG. 4, the critical plating current increases in direct proportion to the line-end density (LeD).

In operation 310 of the method 300 (FIG. 3), an ECP process is performed in an ECP system, e.g., ECP system 100 (FIGS. 1 and 2). A substrate, e.g., substrate 202, to be plated is secured to a substrate holder, e.g., substrate holder 203, and the plating surface of the substrate 202 is brought into contact with a plating solution, e.g., plating solution 230. While in contact with the plating solution, an electrical bias is applied to a seed layer deposited on the plating surface of the substrate 202. The seed layer normally includes a metal the same as the metal to be plated. The electrical bias is generally a bias configured to bias the substrate surface/metal seed layer with a cathodic charge, which causes the metal ions in the plating solution 230 to be urged out of the plating solution 230 and to be plated on the cathodically charged substrate surface/metal seed layer.

In operation 312 of the method 300 (FIG. 3), the plating current flowing through the plating solution between the anode 201 and the substrate 202 is in-situ monitored. In some embodiments, the plating current is monitored using monitoring device 140.

In operation 314 of the method 300 (FIG. 3), the value of the plating current is compared with the value of the critical plating current. If the value of the plating current is above the value of the critical plating current, the ECP process continues. On the other hand, if the value of the plating current is less than the value of the critical plating current, the method 300 proceeds to operation 316, in which the concentration of the organic additives such as suppressors, accelerators, and levelers in the plating solution 230 are adjusted, for example, by the control system 170, to increase the plating current flowed between the anode 201 and the substrate 202, thereby reducing the metal deposition rate at the corners of the contact openings that correspond to the metal lines with the highest line-end density. As a result, void-free metal filling can be achieved across the entire substrate 202. The ECP system 100 of the present disclosure thus helps to improve the reliability of integrated circuits and to increase the manufacturing yield.

Figure 5:
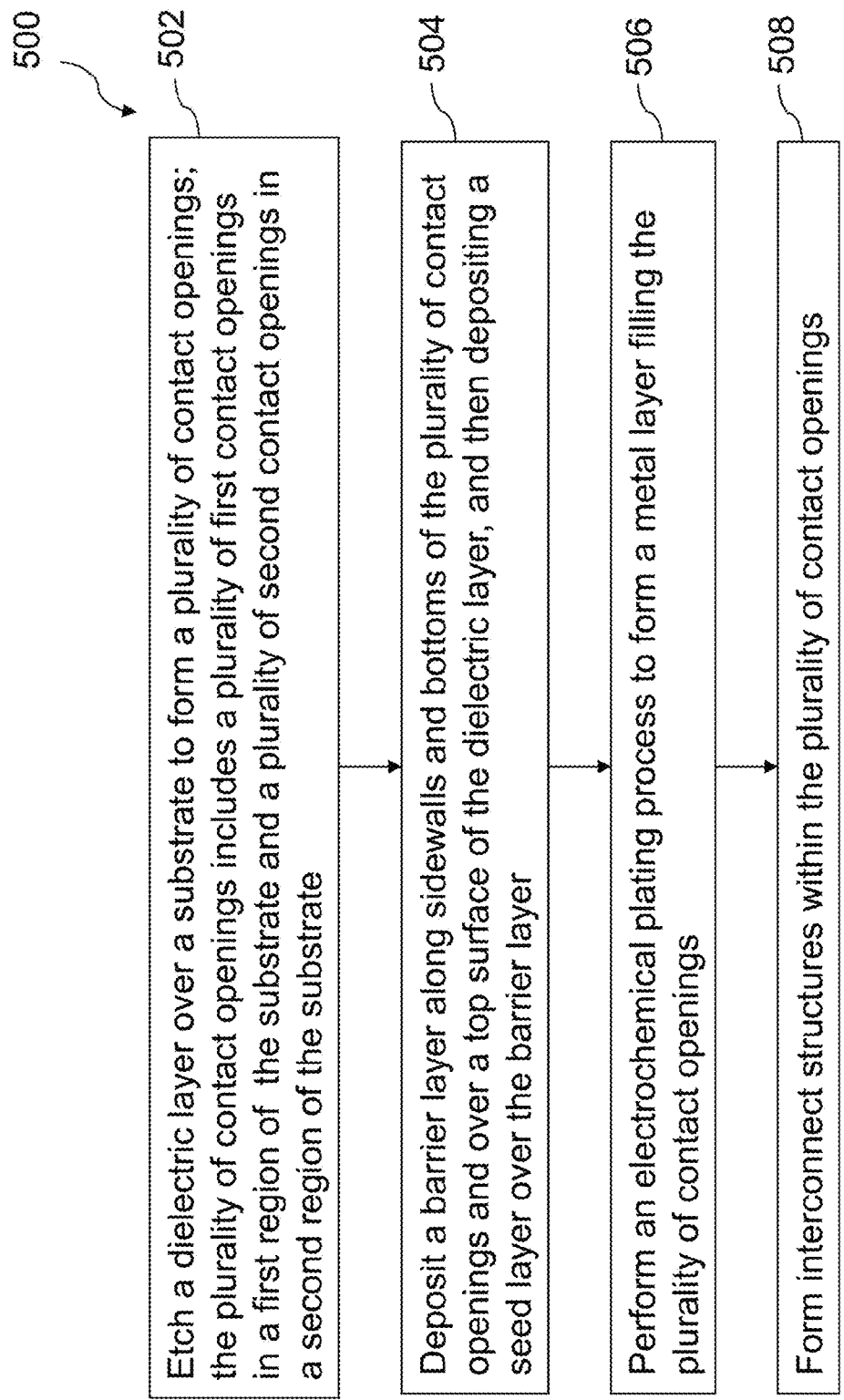
FIG. 5 is a flowchart of a method for fabricating a semiconductor structure, in accordance with some embodiments.

FIG. 5 is a flowchart of a method 500 for fabricating a semiconductor structure 600, in accordance with some embodiments. FIGS. 6A-6D are cross-sectional views of the semiconductor structure 600 in various stages of the method 500, in accordance with some embodiments. The method 500 is discussed in detail below, with reference to the semiconductor structure, in FIGS. 6A-6D. In some embodiments, additional operations are performed before, during, and/or after the method 500, or some of the operations described are replaced and/or eliminated. In some embodiments, additional features are added to the semiconductor structure 600. In some embodiments, some of the features described below are replaced or eliminated. One of ordinary skill in the art would understand that although some embodiments are discussed with operations performed in a particular order, these operations may be performed in another logical order.

Figure 6A:
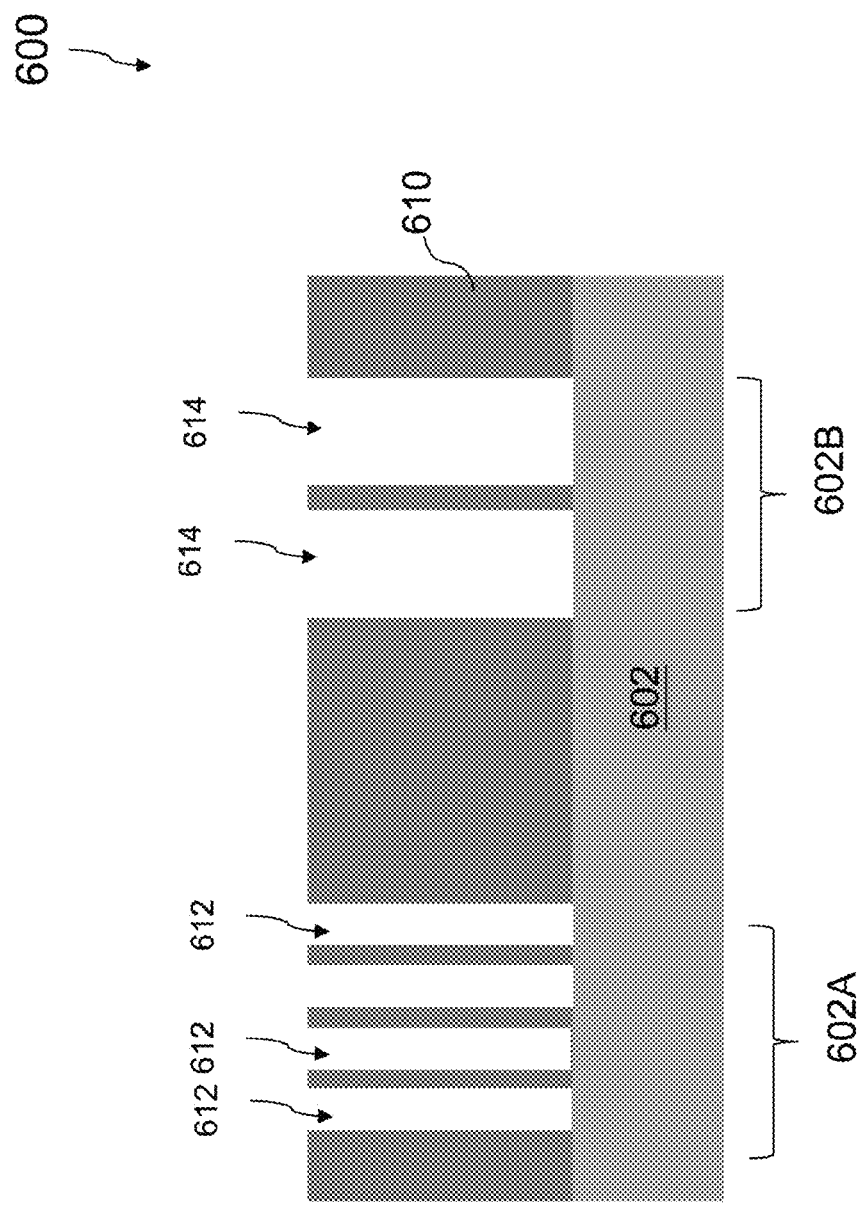
FIGS. 6A-6D are cross-sectional views of a semiconductor structure during various stages of the fabrication process.

Referring to FIG. 5 and FIG. 6A, the method 500 includes operation 502, in which a dielectric layer 610 over a substrate 602 is etched to form a plurality of contact openings 612, 614. FIG. 6A is a cross-sectional view of a semiconductor structure 600 after etching the dielectric layer 610 over the substrate 602 to form the plurality of contact openings 612, 614.

The substrate 602 is first provided. In some embodiments, the substrate 602 is a bulk semiconductor substrate including silicon. Alternatively or additionally, in some embodiments the bulk semiconductor substrate includes another elementary semiconductor such as germanium, a compound semiconductor including gallium arsenide, gallium phosphide, indium phosphide, indium arsenide, and/or indium antimonide, an alloy semiconductor including SiGe, GaAsP, AlInAs, AlGaAs, GaInAs, GaInP, and/or GaInAsP; or combinations thereof. In some embodiments, the substrate 602 includes an epitaxial layer. For example, the substrate 602 has an epitaxial layer overlying a bulk semiconductor substrate. Furthermore, in some embodiments, the substrate 602 is a semiconductor on insulator (SOI) substrate. For example, the substrate 602 includes a buried oxide (BOX) layer formed by a process such as separation by implanted oxygen (SIMOX) or other suitable techniques, such as wafer bonding and grinding.

In some embodiments, the substrate 602 further includes active devices such as p-type field effect transistors (PFET), n-type field effect transistors (NFET), metal-oxide semiconductor (MOS) transistors, complementary metal-oxide semiconductor (CMOS) transistors, bipolar transistors, high voltage transistors, and/or high frequency transistors. In some embodiments, the transistors are planar transistors or three-dimensional fin-type transistors. In some embodiments, the substrate 602 further includes passive devices such as resistors, capacitors, and/or inductors. The substrate 602 further includes isolation structures such as shallow trench isolation (STI) structures to separate various active and/or passive devices from one another. For convenience, any such circuit elements are not shown in FIG. 6A.

The dielectric layer 610 is deposited over the substrate 602. In some embodiments and as in FIG. 6A, the dielectric layer 610 is deposited directly above and in contact with the substrate 602. In some embodiments, one or more dielectric layers containing contact/interconnect structures therein are disposed between the dielectric layer 610 and the substrate 602.

In some embodiments, the dielectric layer 610 includes silicon oxide. In some embodiments, the dielectric layer 610 includes a low-k dielectric material having a dielectric constant (k) less than 4. In some embodiments, the low-k dielectric material has a dielectric constant from about 1.2 to about 3.5. In some embodiments, the dielectric layer 610 includes tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the dielectric layer 610 is deposited by chemical vapor deposition (CVD), plasma enhanced chemical vapor deposition (PECVD), physical vapor deposition (PVD), or spin coating. In some embodiments, the dielectric layer 610 is planarized by a planarization process or otherwise recessed to provide a planar top surface. In some embodiments, the top surface of the dielectric layer 610 is planarized using a CMP process.

The dielectric layer 610 is subsequently etched to form the plurality of contact openings 612, 614 therein. In some embodiments, the contact openings 612, 614 are trenches or combinations of a trench and a via. A plurality of first contact openings 612 is formed in a first region 602A of the substrate 602 and a plurality of second contact openings 614 is formed in a second region 602B of the substrate 602. Due to difference in packing density of circuit elements in the substrate 602, the first contact openings 612 in the first region 602A of the substrate 602 are formed to have a higher density with a higher line-end density, for instance, due to a required higher number of electrical connections in the first region 602A, while the second contact openings 614 in the second region 602B are formed to have a lower density with a lower line-end density, for instance, due to a required lower number of electrical connections in the second region 602B.

The dielectric layer 610 is etched with lithography and etching processes. In some embodiments, the lithography process includes applying a photoresist layer (not shown) over the dielectric layer 610, exposing the photoresist layer to a pattern, performing post-exposure baking, and developing the resist to form a patterned photoresist layer (not shown). The patterned photoresist layer exposes portions of the dielectric layer 610 where the contact openings 612, 614 are to be formed. Next, the portions of the dielectric layer 610 exposed by the patterned photoresist layer are etched to form the contact openings 612, 614. In some embodiments, the dielectric layer 610 is etched using a dry etch such as, for example, a reactive ion etch (RIE) or a plasma etch. In some embodiments, the dielectric layer 610 is etched using a wet etch. After formation of the contact openings 612, 614 in the dielectric layer 610, the patterned photoresist layer is removed, for example, by wet stripping or plasma ashing. Alternatively, in some embodiments, a hard mask is used such that the contact opening pattern is transferred from the pattered photoresist layer to the hard mask by a first etch and then transferred to the dielectric layer 610 by a second etch.

Figure 6B:
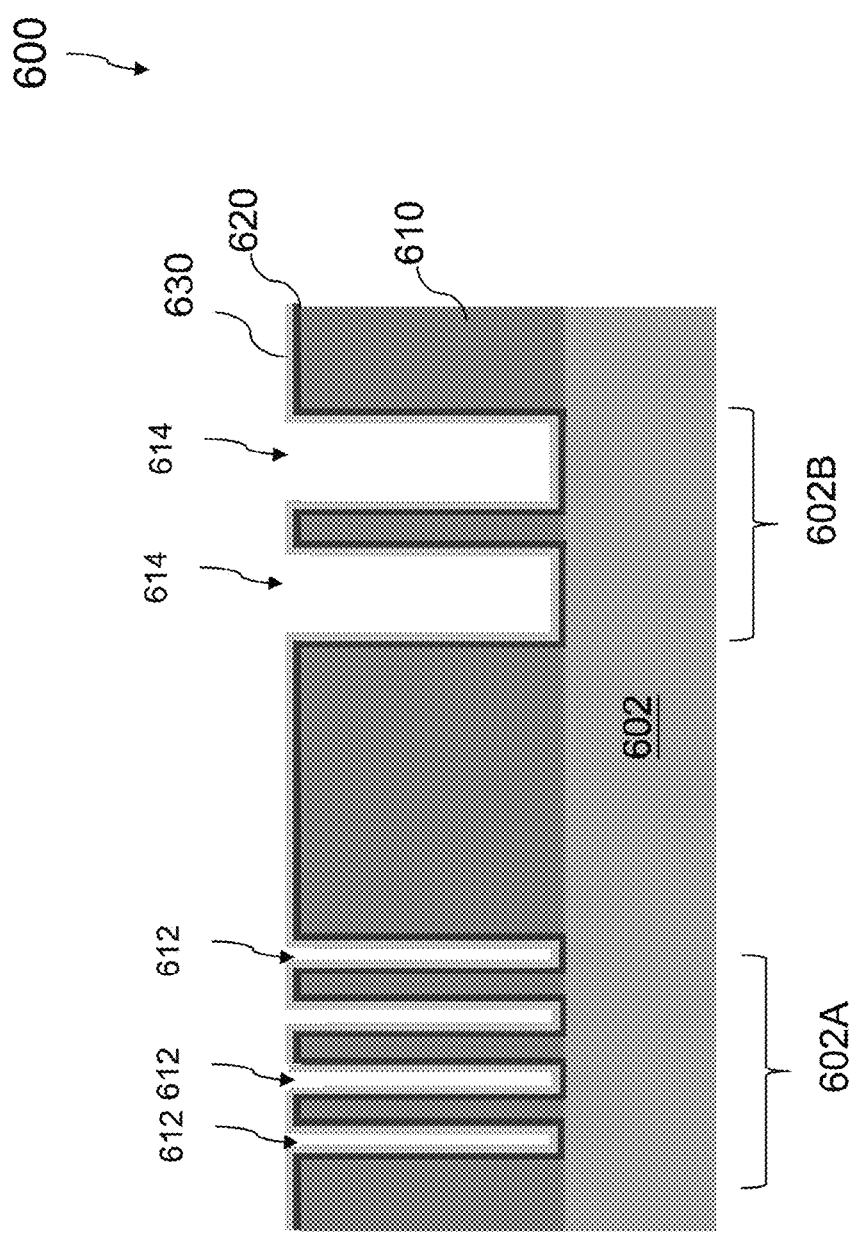

Referring to FIG. 5 and FIG. 6B, the method 500 proceeds to operation 504, in which a barrier layer 620 is deposited along sidewalls and bottoms of the contact openings 612, 614 and over a top surface of the dielectric layer 610, followed by depositing a seed layer 630 over the barrier layer 620. FIG. 6B is a cross-sectional view of the semiconductor structure of FIG. 6A after depositing the barrier layer 620 along sidewalls and bottoms of the contact openings 612, 614 and over the top surface of the dielectric layer 610 and depositing the seed layer 630 over the barrier layer 620.

The barrier layer 620 is deposited over exposed surfaces of the contact openings 612, 614 and the dielectric layer 610. The barrier layer 620 is adapted to prevent diffusion of the metal filled in the contact openings 612, 614 to the dielectric layer 610. The barrier layer 620 also acts to improve the adhesion of the metal to the dielectric layer 610. In some embodiments, the barrier layer 620 includes a refractory metal such as titanium (Ti), tantalum (Ta), or ruthenium (Ru), a metal nitride such as titanium nitride (TiN) or tantalum nitride (TiN), or a bi-layer of the two such as Ti/TiN or Ta/TaN. In some embodiments, the barrier layer 620 is deposited utilizing a conformal deposition process such as CVD, PECVD, PVD, or atomic layer deposition (ALD).

The seed layer 630 is then deposited over the barrier layer 620. In some embodiments, the seed layer 630 includes the same metal used for the metallization fill in order to facilitate the deposition and bonding of the fill metal onto the barrier layer. In some embodiments, the seed layer 630 includes copper for copper metallization. In some embodiments, the seed layer 630 is deposited using a conformal deposition process such as PVD or ALD.

Figure 6C:
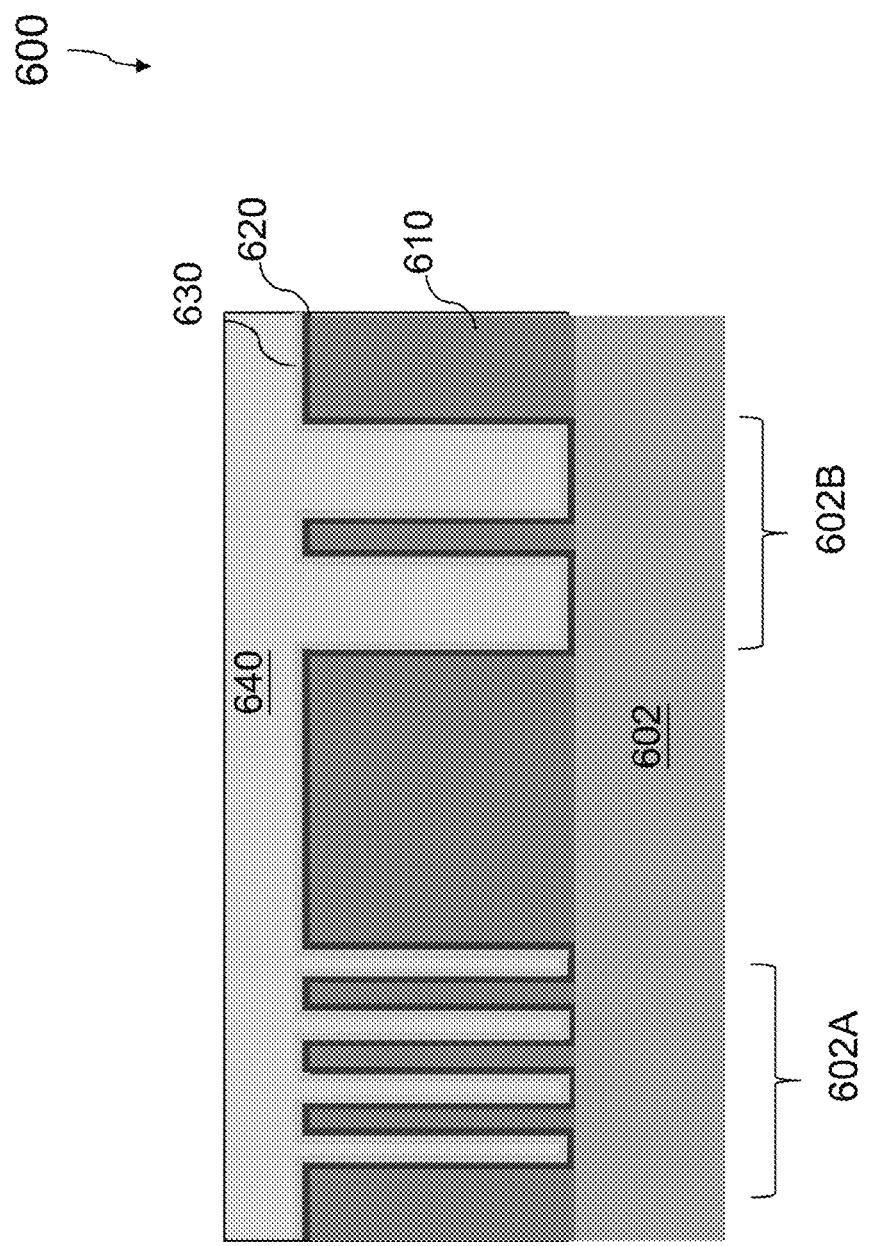

Referring to FIG. 5 and FIG. 6C, the method 500 proceeds to operation 506, in which an ECP process is performed to form a metal layer 640, filling the contact openings 612, 614. FIG. 6C is a cross-sectional view of the semiconductor structure 600 of FIG. 6B after performing the ECP process to form the metal layer 640, filling the contact openings 612, 614.

In some embodiments, the ECP system 100 (FIGS. 1 and 2) is employed for electrochemically plating the substrate 602 so as to form the metal layer 640. During the ECP process, the plating current flowing between the anode 201 and the substrate 202 immersed in the plating solution is monitored by the monitoring device 140 (FIGS. 1 and 2) and the concentration of the organic additives in the plating solution 230 is adjusted to ensure that the ECP process forms a substantially void-free metal layer 640 within both the first contact openings 612 and second contact openings 614. In some embodiments, the metal layer 640 includes copper. In instances wherein the metal layer 640 and the seed layer 630 are composed of a same metal, the boundary between the metal layer 640 and the seed layer 630 is not discernible. It will be understood that although copper is referenced as an example when describing the various embodiments, the plating process described herein is able to be utilized with other metals including, but not limited to, gold (Au), silver (Ag), nickel (Ni), iron (Fe), palladium (Pd), and alloys plating thereof.

Figure 6D:
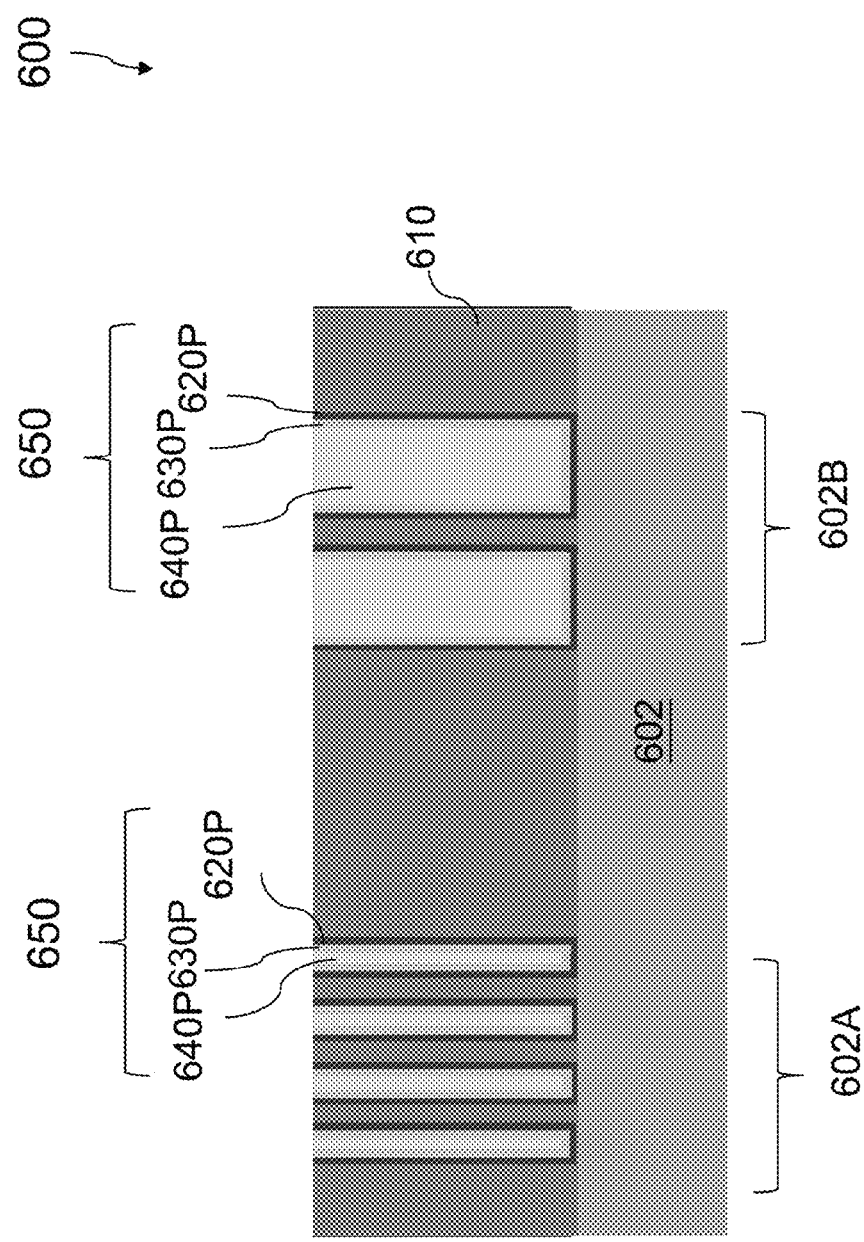

Referring to FIG. 5 and FIG. 6D, the method 500 proceeds to operation 508, in which interconnect structures 650 are formed within the contact openings 612, 614. FIG. 6D is a cross-sectional view of the semiconductor structure 600 of FIG. 6C after forming the interconnect structures 650 within the contact openings 612, 614.

Each of the interconnect structures 650 includes a barrier layer portion 620P lining the sidewalls and bottom of a corresponding contact opening 612, 614, a seed layer portion 630P over the barrier layer portion 620P, and a metal layer portion 640P over the seed layer portion 630P. The interconnect structures 650 are formed by removing portions of the metal layer 640, the seed layer 630 and the barrier layer 620 that are located above the top surface of the dielectric layer 610. In some embodiments, a planarization process such as, for example, CMP is performed to remove portions of the metal layer 640, the seed layer 630 and the barrier layer 620 from the top surface of the dielectric layer 610. After planarization, remaining portions of the barrier layer 620 within the contact openings 612, 614 constitute the barrier layer portions 620P, remaining portions of the seed layer 630 within the contact openings 612, 614 constitute the seed layer portions 630P, and remaining portions of the metal layer 640 within the contact openings 612, 614 constitute the metal layer portions 640P. The barrier layer portions 620P, the seed layer portions 630P, and the metal layer portions 640P have top surfaces coplanar with the top surface of the dielectric layer 610.

FIG. 7 is a block diagram of a control system 170 for controlling operation of an ECP system 100, in accordance with some embodiments. The control system 170 generates output control signals for controlling operation of one or more components of the ECP system 100, in accordance with some embodiments. The control system 170 receives input signals from one or more components of the ECP system 100, in accordance with some embodiments. The control system 170 also compares the value of the plating current flowing between the anode 201 and the substrate 202 immersed in the plating solution 230 with the value of a critical plating current, below which voids are formed in metal lines having the highest line-end density for a given metallization layer, and adjusts the composition of the plating solution 230 once the value of plating current is below the value of the critical plating current. In some embodiments, the control system 170 is located adjacent the ECP system 100. In some embodiments, the control system 170 is remote from the ECP system 100.

The control system 170 includes a processor 702, an input/output (I/O) device 704, a memory 706, and a network interface 708, each communicatively coupled via a bus 710 or other interconnection communication mechanism.

The processor 702 is arranged to execute and/or interpret one or more sets of instructions 712 stored in the memory 706. In some embodiments, the processor 702 is a central processing unit (CPU), a multi-processor, a distributed processing system, an application specific integrated circuit (ASIC), and/or a suitable processing unit.

The I/O interface 704 is coupled to external circuitry. In some embodiments, the I/O interface 704 includes a keyboard, keypad, mouse, trackball, trackpad, and/or cursor direction keys for communicating information and commands to the processor 702.

The memory 706 (also referred to as a computer-readable medium) includes a random access memory or other dynamic storage device, communicatively coupled to the bus 710 for storing data and/or instructions for execution by the processor 702. In some embodiments, the memory 706 is used for storing temporary variables or other intermediate information during execution of instructions to be executed by the processor 702. In some embodiments, the memory 706 also includes a read-only memory or other static storage device coupled to the bus 710 for storing static information and instructions for the processor 702. In some embodiments, the memory 706 is an electronic, magnetic, optical, electromagnetic, infrared, and/or a semiconductor system (or apparatus or device). For example, the memory 706 includes a semiconductor or solid-state memory, a magnetic tape, a removable computer diskette, a random access memory (RAM), a read-only memory (ROM), a rigid magnetic disk, and/or an optical disk. In some embodiments using optical disks, the memory 706 includes a compact disk-read only memory (CD-ROM), a compact disk-read/write (CD-R/W), and/or a digital video disc (DVD).

The memory 706 is encoded with, i.e., storing, the computer program code, i.e., a set of executable instructions 712, for controlling one or more components of the ECP system 100 and causing the control system 170 to perform the ECP process. In some embodiments, the memory 706 also stores information needed for performing the ECP process as well as information generated during performing the ECP process. In some embodiments, the memory 706 stores the critical plating currents corresponding to line-end densities of metal lines that can be extrapolated from the linear model as shown in FIG. 4 as well as the plating currents in situ measured during performing the ECP process.

The network interface 708 includes a mechanism for connecting to a network 709, to which one or more other computer systems are connected. In some embodiments, the network interface 708 includes a wired and/or wireless connection mechanism. The network interface 708 includes wireless network interfaces such as BLUETOOTH, WIFI, WIMAX, GPRS, or WCDMA; or wired network interface such as ETHERNET, USB, or IEEE-1394. In some embodiments, the control system 170 is coupled with one or more components of the ECP system 100 via the network interface 708. In some embodiments, the control system 170 is directly coupled with one or more components of the ECP system 100, e.g., with the components coupled to the bus 710 instead of via the network interface 708.

One aspect of this description relates to a method for performing an electrochemical plating (ECP) process. The method includes contacting a surface of a substrate with a plating solution comprising ions of a metal to be deposited. The method further includes electroplating the metal on the surface of the substrate. The method further includes in situ monitoring a plating current flowing through a plating solution between an anode and the substrate immersed in the plating solution as the ECP process continues. The method further includes adjusting a composition of the plating solution in response to the plating current being below a critical plating current below which voids are formed in a subset of conductive lines having a highest line-end density among a plurality of conductive lines for a metallization layer over the substrate. In some embodiments, adjusting the composition of the plating solution includes adjusting an amount of at least one organic additive in the plating solution. In some embodiments, adjusting the composition of the plating solution includes adjusting an amount of at least one suppressor or at least one accelerator in the plating solution. In some embodiments, the method further includes receiving a layout data of an integrated circuit to be manufactured on the substrate. In some embodiments, the method further includes calculating line-end densities of the plurality of conductive lines in a plurality of unit grids in the substrate based on the layout data. In some embodiments, the method further includes identifying the subset of conductive lines having the highest line-end density in a unit grid of the plurality of unit grids. In some embodiments, the method further includes determining the critical plating current using a linear model that correlates critical plating currents with corresponding line-end densities.

Another aspect of this description relates to a method of forming a semiconductor structure. The method includes forming a plurality of contact openings in a dielectric layer over a substrate. The plurality of contact openings includes a plurality of first contact openings in a first region of the substrate and a plurality of second contact openings in a second region of the substrate. The plurality of first contact openings having a highest line-end density in the plurality of contact openings. The method further includes depositing a barrier layer along sidewalls and bottoms of the plurality of contact openings and over the dielectric layer. The method further includes depositing a seed layer over the barrier layer. The method further includes performing an electrochemical plating (ECP) process to fill the plurality of contact openings with a conductive layer. Performing the ECP process includes in situ monitoring a plating current flowing through the plating solution between an anode and the substrate immersed in the plating solution as the ECP process continues, and adjusting a composition of the plating solution in response to the plating current being below a critical plating current that causes voids being formed in the plurality of first contact openings. In some embodiments, forming the plurality of contact openings in the dielectric layer includes etching the dielectric layer using an anisotropic etch. In some embodiments, the method further includes removing portions of the conductive layer, the seed layer and the barrier layer from a top surface of the dielectric layer. In some embodiments, performing the ECP process further includes applying a bias between the substrate and an anode positioned in the plating solution. In some embodiments, performing the ECP process further includes comparing the plating current in situ measured with the critical plating current as the ECP process proceeds. In some embodiments, depositing the barrier layer comprises depositing titanium (Ti), tantalum (Ta), or ruthenium (Ru), titanium nitride (TiN), tantalum nitride (TiN), Ti/TiN or Ta/TaN. In some embodiments, depositing the seed layer comprises depositing copper.

Still another aspect of this description relates to an electrochemical plating (ECP) system. The ECP system includes an ECP cell comprising a plating solution for an ECP process, a monitoring device configured to in situ measure a plating current flowing through the plating solution between an anode and a substrate to be plated as the ECP process continues, a plating solution supply system in fluid communication with the ECP cell and configured to supply the plating solution to the ECP cell, and a control system operably coupled to the ECP cell, the monitoring device and the plating solution supply system. The control system is configured to compare the plating current with a critical plating current, and adjust a composition of the plating solution in response to the plating current being below the critical plating current. In some embodiments, the monitoring device includes a probe adapted to be partially immersed in the plating solution. In some embodiments, the plating solution includes a metal salt and organic additives. The control system is configured to adjust an amount of at least one of the organic additives in the plating solution. In some embodiments, the ECP system further includes one or more spin rinse dry cells and one or more substrate bevel cleaning cells. In some embodiments, the ECP system further includes a factory interface including a plurality of substrate loading stations. In some embodiments, the ECP system further includes an anneal chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor structure, comprising:
   forming a plurality of contact openings in a dielectric layer over a substrate;
   depositing a seed layer over surfaces of the plurality of contact openings and the dielectric layer;
   introducing the substrate into an electrochemical plating (ECP) system comprising:
      an ECP cell comprising a plating solution;
      a monitoring device configured to in situ measure a plating current flowing through the plating solution between an anode and the substrate;
      a plating solution supply system in fluid communication with the ECP cell and configured to supply the plating solution to the ECP cell; and
      a control system operably coupled to the ECP cell, the monitoring device and the plating solution supply system; and configured to control the ECP cell, the monitoring device and the plating solution supply system;
   electrodepositing a conductive layer over the seed layer, thereby forming a plurality of conductive lines in the plurality of contact openings, the plurality of conductive lines comprising a subset of conductive lines having a highest line-end density;
   in situ monitoring the plating current during electrodepositing the conductive layer;
   receiving a layout data of a metallization layer in an integrated circuit corresponding to the plurality of conductive lines;
   calculating a line-end density of the plurality of conductive lines in each of a plurality of unit grids defined in the substrate based on the layout data;
   identifying the subset of conductive lines having the highest line-end density in a unit grid of the plurality of unit grids;
   determining a critical plating current below which voids are formed in the subset of conductive lines by using a linear model that correlates plating currents which result in defects with corresponding line-end densities;
   comparing the plating current with the critical plating current; and
   adding one or more organic additives to the plating solution in response to the plating current being below the critical plating current so as to increase the plating current until the plating current is greater than the critical plating current.

2. The method of claim 1, wherein the monitoring device comprises a probe adapted to be partially immersed in the plating solution.

3. The method of claim 1, wherein the plating solution comprises a metal salt and organic additives, wherein the control system is configured to adjust an amount of at least one of the organic additives in the plating solution.

4. The method of claim 1, wherein the ECP system further comprises one or more spin rinse dry cells and one or more substrate bevel cleaning cells.

5. The method of claim 1, wherein the ECP system further comprises a factory interface comprising a plurality of substrate loading stations.

6. The method of claim 1, wherein each line-end density is calculated as a ratio of a surface area of the plurality of conductive lines in a corresponding unit grid and an area of the corresponding unit grid.

7. The method of claim 1, wherein the ECP system further comprises an anneal chamber.

8. The method of claim 7, wherein the anneal chamber comprises a cooling plate and a heating plate.

9. The method of claim 8, wherein the ECP system further comprises a substrate transfer robot configured to move the substrate between the cooling plate and the heating plate.

10. A method for depositing a conductive layer on a plurality of substrates, comprising:
    introducing the plurality of substrates into an electrochemical plating (ECP) system; comprising:
       a plurality of ECP cells, each of the plurality of ECP cells comprising an anode, a substrate holder configured to hold a corresponding substrate of the plurality of substrates to be plated by an ECP process, and a plating bath containing a plating solution for the ECP process;
       a plurality of monitoring devices, each of the plurality of monitoring devices being coupled to a corresponding ECP cell of the plurality of ECP cells and configured to in situ measure a plating current flowing through the plating solution between the anode and the corresponding substrate in the corresponding ECP cell;
       a plating solution supply system in fluid communication with the plurality of ECP cells and configured to supply the plating solution to each of the plurality of ECP cells; and
       a control system configured to control the plurality of ECP cells, the plurality of monitoring devices and the plating solution supply system, immersing each of the plurality of substrates in the plating solution of a corresponding ECP cell;
    in situ measuring a plating current flowing through the plating solution between an anode and a corresponding substrate;
    comparing the plating current with a critical plating current below which voids start to occur in conductive lines having a highest line-end density in a metallization layer formed over the substrate, wherein the critical plating current is determined by:
    receiving a layout data of an integrated circuit to be manufactured on the substrate;
    dividing an entire area of the substrate into a plurality of unit grids;
    calculating a line-end density of conductive lines in each unit grid of the plurality of unit grids;
    identifying a unit grid with the conductive lines having the highest line-end density among the plurality of unit grids; and
    determining the critical plating current using a linear model that correlates plating currents which result in defects with corresponding line-end densities; and
    adding one or more organic additives to the plating solution in response to the plating current being below the critical plating current so as to increase the plating current until the plating current is greater than the critical plating current.

11. The method of claim 10, wherein each of the plurality of monitoring devices is a current meter.

12. The method of claim 11, wherein each of the plurality of monitoring devices comprises a probe configured to be in contact with the plating solution during the ECP process to in situ measure the plating current, wherein the probe comprises a metal to be electrochemically plated on the plurality of substrates.

13. The method of claim 10, wherein the plating solution comprises a metal salt and organic additives, wherein the control system is configured to adjust an amount of at least one of the organic additives in the plating solution.

14. The method of claim 13, wherein a quantity of the one or more organic additives being added to the plating solution is controlled to maintain an atomic ratio of carbon and metal in the conductive lines greater than 1%.

15. A method for forming a semiconductor structure, comprising:
  depositing a dielectric layer on a substrate;
    forming a plurality of contact openings having different line-end densities in the dielectric layer;
    depositing a barrier layer along sidewalls and bottoms of the plurality of contact openings and over the dielectric layer;
    depositing a seed layer over the barrier layer;
    contacting the seed layer with a plating solution comprising a salt of an electrically conductive metal and organic additives comprising a suppressor, an accelerator and a leveler, the plating solution is held in an electrochemical plating (ECP) cell,
    applying a plating current to the substrate using a power supply to thereby deposit the electrically conductive metal on the seed layer;
    in situ monitoring the plating current as the electrically conductive metal being deposited on the seed layer using a monitoring device;
    receiving a layout data of a metallization layer to be manufactured over the substrate;
    dividing an entire area of the substrate into a plurality of unit grids;
    calculating a line-end density of conductive lines in each of the plurality of unit grids;
    identifying a unit grid with a subset of conductive lines having a highest line-end density among the plurality of unit grids;
    determining a critical plating current using a linear model that correlates plating currents which result in defects with corresponding line-end densities;
    comparing the plating current with the critical plating current with a control system, wherein the critical plating current corresponds a current below which voids are formed in the subset of conductive lines having the highest line-end density; and
    increasing an amount of at least one organic additive in the plating solution in response to the plating current being below the critical plating current so as to increase the plating current until the plating current is greater than the critical plating current.

16. The method of claim 15, wherein the power supply is coupled to an anode and a substrate holder that holds the substrate.

17. The method of claim 15, wherein the monitoring device provides the plating current to the control system in real time.

18. The method of claim 15, further comprising supplying the plating solution to the ECP cell using a plating solution supply system.

19. The method of claim 15, wherein the at least one organic additive comprises polyethylene glycol, polypropylene oxide, bis(sodium sulfopropyl)-disulfide, 3-mercapto-1-propane sulfonic acid sodium salt, N-dimethyl-dithiocarbamyl propylsulfonic acid sodium salt, 3-S-isothiuronium propyl sulfonate, an polyacrylic acid, polyamine, polyacrylamide, a phenazine azo-dye, an alkoxylated amine surfactant, a polypyridine derivative, or combinations thereof.

20. The method of claim 15, wherein forming the plurality of contact openings comprises:
  applying photoresist layer on the dielectric layer;
  exposing the photoresist layer to a pattern;
  developing the photoresist layer to form a patterned photoresist layer; and
  removing portions of the dielectric layer not covered by the patterned photoresist layer.

* * * * *